United States Patent
Masaki et al.

(10) Patent No.: US 8,129,663 B2
(45) Date of Patent: Mar. 6, 2012

(54) VACUUM HEATING APPARATUS

(75) Inventors: Nobuyuki Masaki, Saitama (JP); Yuichi Sasuga, Yamanashi (JP); Masami Shibagaki, Fuchu (JP); Hiroshi Doi, Chofu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 20 days.

(21) Appl. No.: 12/483,691

(22) Filed: Jun. 12, 2009

(65) Prior Publication Data

US 2009/0321412 A1  Dec. 31, 2009

(30) Foreign Application Priority Data

Jun. 27, 2008  (JP) .................. 2008-168683

(51) Int. Cl.
*F27D 11/00* (2006.01)
*C23C 16/00* (2006.01)

(52) U.S. Cl. ........ 219/438; 219/390; 219/405; 219/411; 118/724; 118/725; 118/50.1; 432/247; 110/334

(58) Field of Classification Search .................. 219/438, 219/390, 405, 411; 118/724–725, 50.1; 573/112; 110/334; 432/247
See application file for complete search history.

(56) References Cited

U.S. PATENT DOCUMENTS 5,750,436 A * 5/1998 Yamaga et al. ............... 438/558
6,288,368 B1 * 9/2001 Kawada et al. ............... 219/405
2009/0218579 A1 9/2009 Shibagaki ....................... 257/77

FOREIGN PATENT DOCUMENTS

| JP | 07-280099 | 10/1995 |
|---|---|---|
| JP | 11-345776 | 12/1999 |
| JP | 2000-012549 | 1/2000 |
| JP | 2000-036370 | 2/2000 |
| KR | 2001-0064698 A | 7/2001 |

OTHER PUBLICATIONS

Chinese office action issued by The State Intellectual Property Office of P.R. China in corresponding application No. 200910148681.5, dated Dec. 3, 2010, along with its English-language translation—10 pages.

* cited by examiner

*Primary Examiner* — Shawntina Fuqua
(74) *Attorney, Agent, or Firm* — Fitzpatrick, Cella, Harper & Scinto

(57) ABSTRACT

Deterioration of an O ring due to radiation heating in a vacuum heating apparatus is prevented to allow heat treatment of a substrate with good annealing properties. The vacuum heating apparatus 1 includes a vacuum chamber 2 constituted by flanges 11 and 12 having an opening portion 9 and joined together, a turbo molecular pump 17 for exhausting gas from the vacuum chamber 2, and a heater base 3 for heating a substrate 5 placed in the vacuum chamber 2. Joint surfaces of the flanges 11 and 12 are sealed by an O ring 10. Further, bonding steps 13 are formed between the heater base 3 and the O ring 10 on the joint surfaces of the flanges 11 and 12, thereby preventing thermo-radiation from the heater base 3 from reaching the O ring 10 through the joint surfaces of the flanges 11 and 12.

6 Claims, 3 Drawing Sheets

VACUUM HEATING APPARATUS

CROSS-REFERENCES TO RELATED APPLICATIONS

This application claims the benefit of priority from Japanese Patent Application No. 2008-168683 filed Jun. 27, 2008, the entire contents of which is incorporated herein by reference.

BACKGROUND OF THE INVENTION

1. Field of the Invention

The present invention relates to a vacuum heating apparatus, and more particularly to an electron impact (collision) heating device in which a thermo-electron emitted from a filament by an acceleration voltage is caused to collide with a heater to generate heat.

2. Related Background Art

A semiconductor production technique often requires a process of rapidly heating a semiconductor substrate. Particularly, activation annealing of a wide band gap semiconductor such as silicon carbide (SiC) requires high temperature of about 2000° C.

As an example of a vacuum heating apparatus, an electron impact heating device has been proposed in which a thermo-electron emitted from a filament by an acceleration voltage applied between the filament and a vacuum chamber is caused to collide with a heater to generate heat (Japanese Patent No. 2912613, Japanese Patent No. 2912616, and Japanese Patent No. 2912913).

In the vacuum heating apparatus, an aluminum vacuum chamber is used having high thermal conductivity and low emissivity.

However, the aluminum vacuum chamber has a soft flange portion for joining members that constitute the vacuum chamber, and thus use of a metal gasket is difficult and an ring seal of fluororubber or resin is used for a vacuum seal. Meanwhile, as described above, an activation annealing process for electrically activating a silicon carbide (SiC) substrate into which an impurity is ion-implanted requires very high temperature of about 2000° C.

Specifically, an amount of thermo-radiation to the vacuum chamber is significantly increased as compared with in an annealing process with thermo-radiation from a heater of about 1000° C. that has been used in a conventional silicon (Si) device.

As described above, with a structure in which an O ring is simply held as usual in a very high temperature region of 2000° C., radiation heating during heat treatment reduces exhaust properties due to deterioration of the O ring, and also reduces annealing properties.

Specifically, the vacuum heating apparatus was assembled to release gas for heating, and then a sample of a silicon carbide (SiC) epitaxial substrate into which aluminum was implanted at, for example, 500° C. at a concentration of $2.0 \times 10^{18}/cm^3$ was annealed at 2000° C. for 10 min.

In this case, maximum pressure of the vacuum chamber during annealing is $3.6 \times 10^{-4}$ Pa, and when surface flatness of a sample surface after annealing was measured by an atomic force microscope (AFM), very good flatness with an RMS (Root-Mean-Square) value of 0.6 nm was obtained.

However, when the sample was annealed at 2000° C. for 10 min to (?) 1000 times, and then the same sample was annealed at 2000° C. for 10 min, the maximum pressure of the vacuum chamber during annealing was $7.6 \times 10^{-3}$ Pa, and the degree of vacuum was reduced. When surface flatness of the sample surface after annealing was measured by the atomic force microscope (AFM), there was a rough surface with an RMS value of 3.5 nm.

Further, when ultimate pressure of the vacuum chamber was measured, it was recognized that the pressure was $4.3 \times 10^{-4}$ Pa and vacuum properties were reduced by about two digits. Specifically, a conventional O ring seal in which two parallel seal surfaces are placed to face each other and an O ring made of fluororubber or resin is placed and held in a groove provided between the seal surfaces directly receives radiation from heating means for heating up to around 2000° C.

Thus, the O ring is deteriorated in a short time to release gas, thereby reducing the vacuum properties of the vacuum chamber. This also reduces flatness of the substrate surface during annealing.

The present invention has an object to prevent deterioration of an O ring due to radiation heating in a vacuum heating apparatus, and allow heat treatment of a substrate with good annealing properties.

SUMMARY OF THE INVENTION

To solve the above described problems, the present invention provides a vacuum heating apparatus including: a vacuum chamber constituted by members such as flanges having an opening portion and joined together; exhaust means for exhausting gas from the vacuum chamber; and heating means that is placed in the opening portion of the members and heats a substrate placed in the vacuum chamber, wherein the members are sealed by an O ring, and bonding steps are formed between the heating means and the O ring on joint surfaces of the members.

According to the present invention, the vacuum heating apparatus has a structure including the steps on the joint surfaces on an inner peripheral side of the O ring, thereby preventing radiation heating from a heater to the O ring, and preventing reduction in vacuum properties. A very high temperature region of a heater temperature of 2000° C. can be stably used, and good surface flatness during annealing can be achieved for a device using a single crystal silicon carbide substrate.

DESCRIPTION OF THE PREFERRED EMBODIMENTS

Now, preferred embodiments for carrying out the present invention will be described with reference to the accompanying drawings.

First Embodiment

Figure 1:
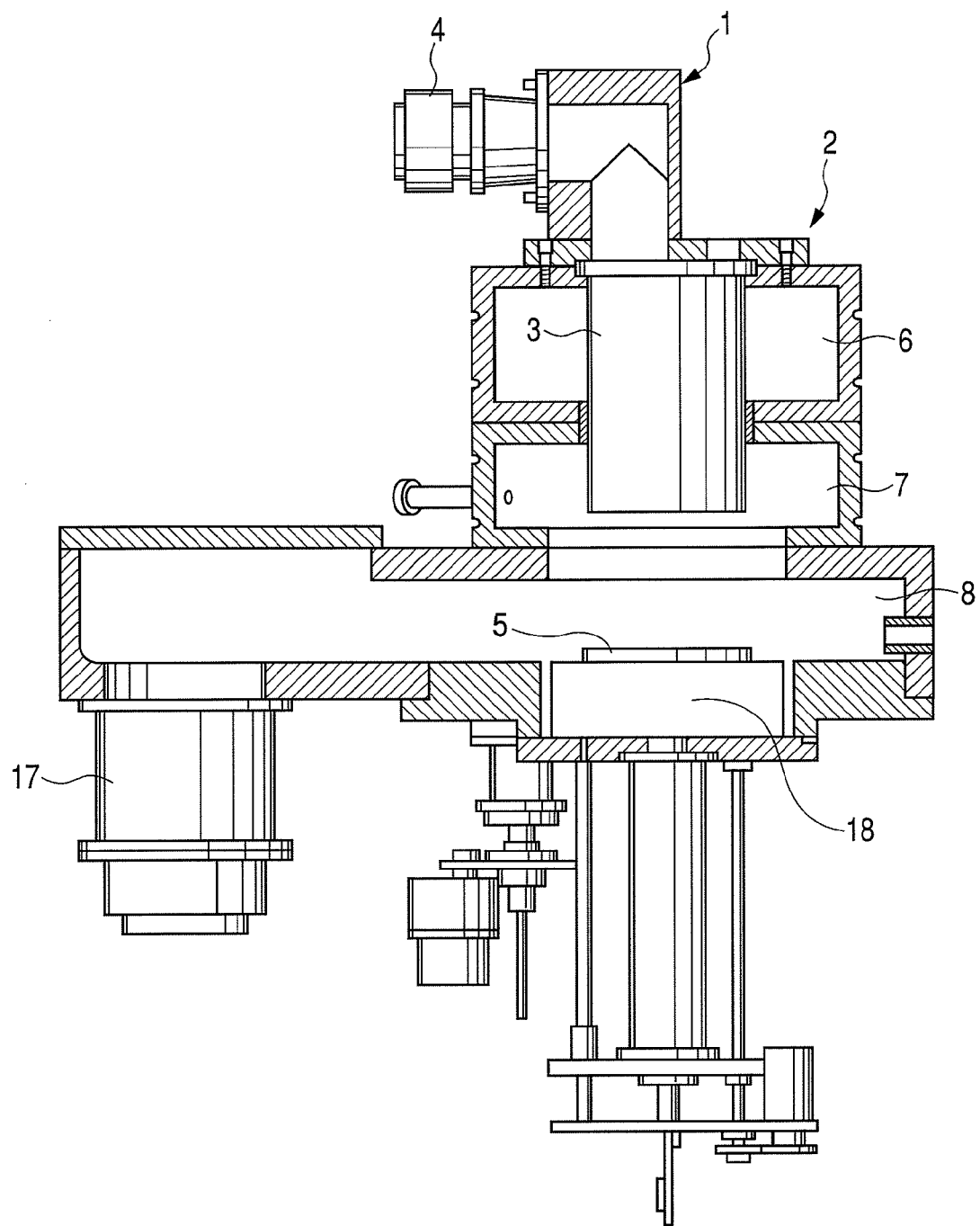
FIG. 1 shows an electron collision type vacuum heating apparatus according to an embodiment of the present invention.

FIG. 1 shows an electron collision type vacuum heating apparatus according to an embodiment of the present invention.

As shown in FIG. 1, a vacuum heating apparatus 1 of this embodiment includes a vacuum chamber 2, a heater base 3 for heating a substrate 5 placed in the vacuum chamber 2, and a turbo molecular pump 17 as exhaust means for exhausting gas from the vacuum chamber 2. The vacuum chamber 2 is made of aluminum in this embodiment.

The heater base 3 includes unshown heating means.

For example, a carbon heater base 3 may include a tungsten filament (not shown) as heating means.

Herein, electron collision heating type heating means is exemplified in which a thermo-electron heated and emitted from a heated filament (not shown) is accelerated and caused to collide with the carbon heater base 3 by an acceleration voltage applied between the filament and the heater base 3 to heat the heater base 3.

Gas is exhausted from the vacuum chamber 2 on a side of treatment of the substrate 5 into high vacuum by a turbo molecular pump 4 to exhaust gas generated from carbon of the heater base 3 or high melting point metal of the filament and the like and prevent contamination of the vacuum chamber 2 when a very high temperature is reached by the above described method. Further, gas is exhausted from the vacuum chamber 2 on a side of heat treatment of the substrate 5 into high vacuum by a turbo molecular pump 17. The substrate 5 subjected to heat treatment is placed on a heat acceptor plate (not shown) or the like mounted to a substrate holder 18 facing the heater base 3. When the substrate 5 is conveyed or cooled, the substrate holder 18 is moved down. When the substrate 5 is subjected to heat treatment, the substrate holder 18 is moved up so that the substrate 5 and the heater base 3 are brought close to each other with a distance therebetween of, for example, 3 mm, thereby allowing efficient heat treatment.

Figure 2:
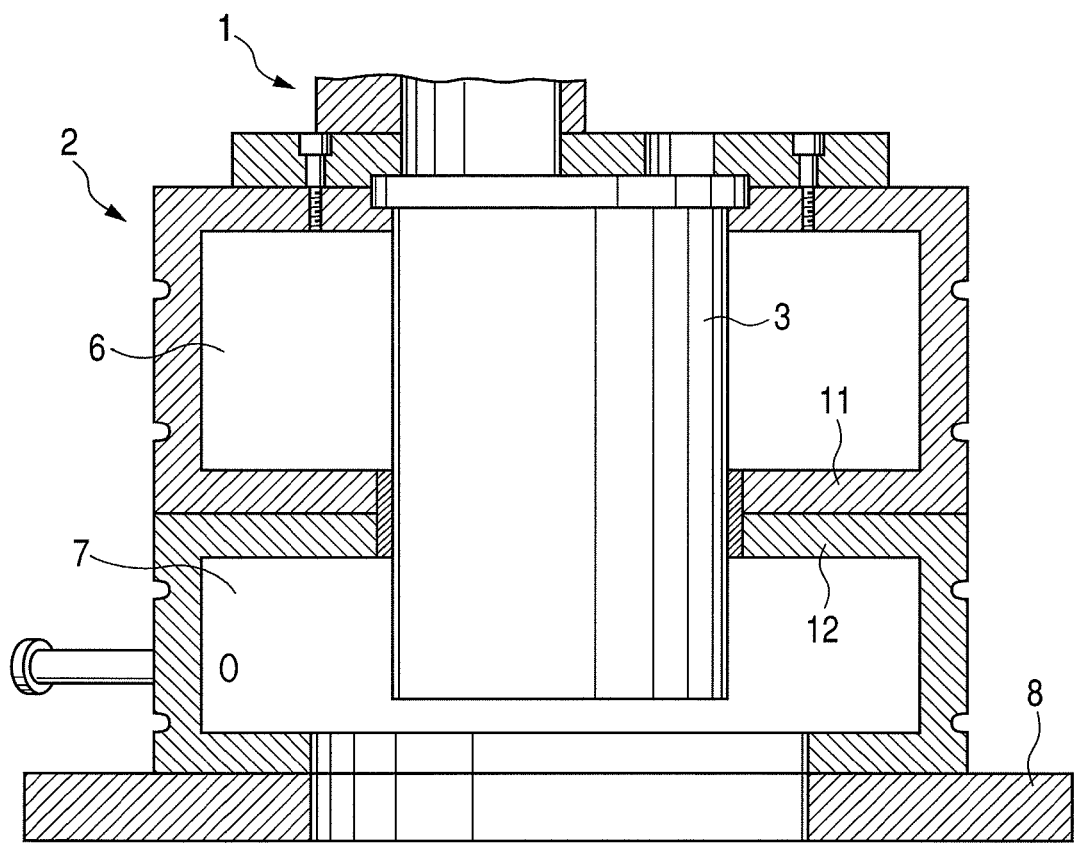
FIG. 2 is an enlarged view of a vacuum chamber in the vacuum heating apparatus 1 in FIG. 1.

FIG. 2 is an enlarged view of an upper portion of the vacuum chamber 2 in the vacuum heating apparatus 1 in FIG. 1.

As shown in FIG. 2, the vacuum chamber 2 is constituted by, for example, annular members of a plurality of flanges 11 and 12 having an opening portion and joined together, and includes an upper portion 6, an intermediate portion 7, and a lower portion 8. An O ring (not shown) is held between the members (flanges) to seal joint surfaces of the members (flanges) that constitute the vacuum chamber 2. For thermal separation and the like of a space between the heater base 3 and the vacuum chamber 2, the O ring (not shown) is used to form a vacuum seal portion by joining of the flanges 11 and 12.

As described above, the vacuum chamber 2 is made of aluminum having high thermal conductivity and low emissivity. The flanges 11 and 12 joined together of the members that constitute the vacuum chamber 2 are also soft, and thus use of a metal gasket is difficult and for example, fluororubber is used as a seal material.

The fluororubber has heat resistance up to about 150° C. to 200° C., and the upper portion of the vacuum chamber 2 is separated into the upper space 6 and the lower space 7 by the flanges 11 and 12 to block thermo-radiation from a lower portion of the heater base 3 and increase a cooling effect of the seal material of fluororubber.

One flange 11 of the vacuum chamber 2 is subjected to seal surface machining, the other facing flange 12 is provided with a groove for an O ring, and the O ring (not shown) is held between the two flange surfaces and fastened by a screw (not shown) at an atmospheric pressure portion on an outside to form the vacuum seal portion. The O ring (not shown) is, for example, made of fluororubber.

Figure 3:
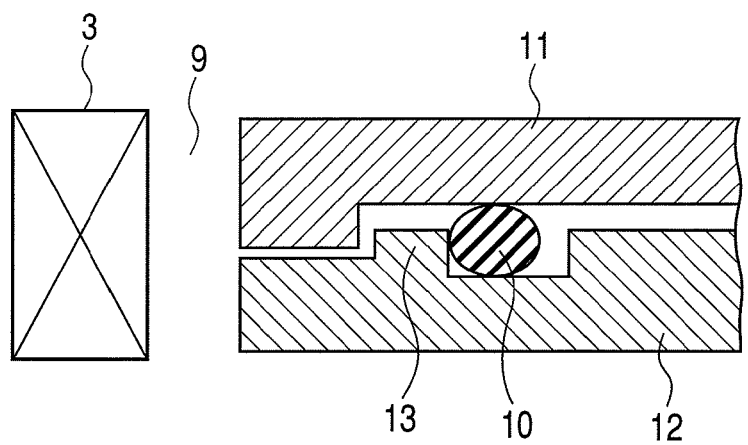
FIG. 3 is an enlarged sectional view of a joint portion between flanges of a vacuum chamber in a first embodiment of the present invention.

FIG. 3 is an enlarged sectional view of a joint portion between the flanges 11 and 12 of the vacuum chamber 2 in this embodiment. The same members as in FIG. 1 or FIG. 2 are denoted by the same reference numerals.

The upper portion 6 and the intermediate portion 7 that constitute the vacuum chamber 2 are joined by the two flanges 11 and 12 having an opening portion 9, and for example, the carbon heater base 3 is placed in the opening portion 9 as heating means. One of bonding steps 13 is formed at the side of the heating means on one flange 12 having a groove in which the O ring 10 is embedded, that is, between the heater base 3 and the O ring 10.

The other of the bonding steps 13 is fabricated at the side close to the heater base 3 on the flange 11. The bonding steps are set or inlaid to each other.

The O ring 10 made of, for example, fluororubber is held between the flanges 11 and 12 and fastened by an unshown bolt to provide a vacuum seal, and simultaneously the flange surfaces on the side closer to the heater base 3 as the heating means vertically bond with each other.

Thus, thermo-radiation from the heater base 3 does not reach the O ring 10 through the joint surfaces of the flanges 11 and 12, thereby protecting the O ring 10.

Further, an inner surface of the vacuum chamber 2 is subjected to mirror finishing to have emissivity of 0.15.

Annealing properties of a substrate using the vacuum chamber 2 in this embodiment were evaluated. For the evaluation, a 4H single crystal silicon carbide (SiC) substrate treated as described below was used as a test substrate.

Specifically, an n-type epitaxial layer having a thickness of 10 μm was formed on the test substrate by chemical vapor deposition (CVD), and the test substrate was subjected to sacrifice oxidization at 900° C. for 30 min in an oxygen ($O_2$) atmosphere in an oxidization furnace so as to have a film thickness of 10 nm. Then, the test substrate was subjected to hydrofluoric acid treatment to expose a clean surface, and a protective oxide film in ion implantation having a film thickness of 10 nm was formed under the same condition in the oxidization furnace.

Further, an ion implantation apparatus was used to heat the test substrate to 500° C., and aluminum as impurity was implanted into the test substrate at 500° C. at a concentration of $2.0 \times 10^{18}/cm^3$ into a box shape in six stages of implantation energy. Specifically, the six stages of the energy are 40, 100, 200, 350, 500 and 700 keV.

Then, the ion implantation protective film was removed by hydrofluoric acid, and then the test substrate was annealed at an acceleration voltage of 2.3 kV and 2000° C. for 10 min. At this time, maximum pressure of the vacuum chamber 2 during annealing was $3.4 \times 10^{-4}$ Pa and substantially the same as an initial value of a conventional apparatus. Gas was exhausted for 24 hours and then an ultimate degree of vacuum was measured, and very good vacuum with pressure of $1.5 \times 10^{-6}$ Pa was obtained.

Next, to evaluate surface flatness of the test substrate after annealing, the surface flatness was measured by an atomic force microscope (AFM) within a measurement range of 4 micrometers×4 micrometers in a tapping mode. Thus, it was recognized that very good flatness with an RMS value of 0.6 nm was obtained.

The surface of the test substrate was removed by 40 nm by sacrifice oxidization and dry etching, then an aluminum electrode was formed by lift-off, and an activation ratio was calculated by CV measurement. Thus, it was recognized that an activation ratio of 100 percent was obtained, and sufficient activation was performed.

Also, to confirm heat resistance of the O ring, the test substrate was annealed at 2000° C. for 10 min to (?) 1000 times in a row, and then the same test substrate was annealed at 2000° C. for 10 min.

At this time, maximum pressure of the vacuum chamber 2 during annealing was $3.5 \times 10^{-4}$ Pa and substantially the same as an initial value, and a reduction in the degree of vacuum was not recognized. Also after activation annealing, very good flatness with an RMS value of 0.6 nm was obtained. Further, the heater base 3 was cooled, gas was exhausted for 24 hours, and an ultimate degree of vacuum was measured. Then, it was recognized that very good vacuum with pressure of $1.7 \times 10^{-6}$ Pa was obtained.

Second Embodiment

Figure 4:
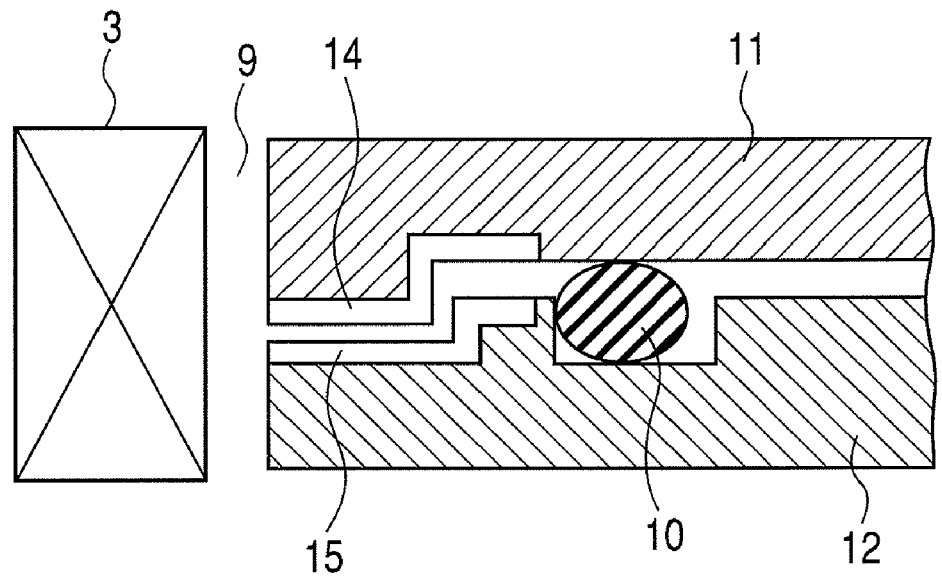
FIG. 4 is an enlarged sectional view of a joint portion between flanges of a vacuum chamber in a second embodiment of the present invention.

FIG. 4 is an enlarged sectional view of a joint portion between flanges 11 and 12 of a vacuum chamber 2 in a second embodiment of the present invention.

Two aluminum flanges 11 and 12 are formed close to a carbon heater base 3. Inner surfaces 14 and 15 on a side closer to the heater base 3 than an O ring 10, that is, on a side closer to heating means than steps 13 in joint surfaces of the flanges 11 and 12 are finished with surface roughness to have emissivity of 0.3 or more. In this embodiment in particular, the emissivity is 0.35.

Specifically, in this embodiment, the joint surfaces 14 and 15 having the steps 13 between the heater base 3 and the O ring 10 in the joint surfaces of the flanges 11 and 12 have higher emissivity than portions other than the joint surfaces. This causes thermo-radiation emitted from the heater base 3 to be absorbed by the inner surfaces 14 and 15 of the flanges to further reduce an amount of thermo-radiation reaching the O ring.

The same advantage can be obtained by applying carbon spray to a thickness of 50 μm, or applying ceramic coating to at least one of the stepped joint surfaces 14 and 15 to a thickness of 40 μm.

Third Embodiment

Figure 5:
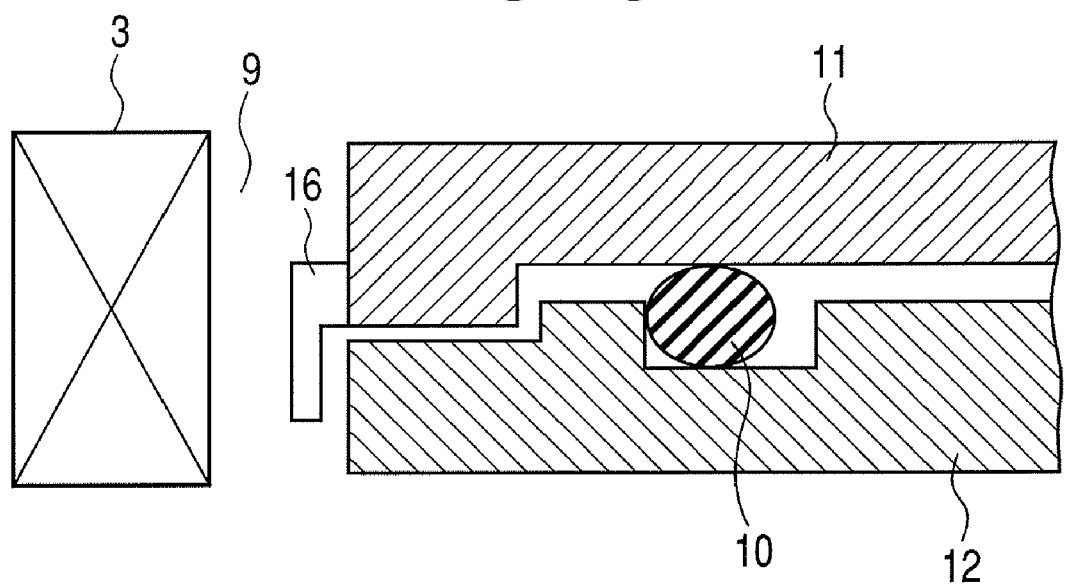
FIG. 5 is an enlarged sectional view of a joint portion between flanges of a vacuum chamber in a third embodiment of the present invention.

FIG. 5 is an enlarged sectional view of a joint portion between flanges 11 and 12 of a vacuum chamber 2 in a third embodiment of the present invention.

In this embodiment, a shield plate 16 is formed by welding near joint surfaces on an inner peripheral side of the flanges 11 and 12 close to a heater base 3. This allows thermo-radiation emitted from the heater base 3 to be blocked by the shield plate 16, thereby preventing the thermo-radiation from directly reaching an O ring 10.

The flanges 11 and 12, the opening portion 9, the heater base 3 and the like are cylindrical, and in the examples in FIGS. 3, 4 and 5, the steps 13, the O ring 10, the shield plate 16 and the like are arranged to surround an outer periphery of the heater base 3. In the above embodiments, joining between the upper portion 6 and the intermediate portion 7 is described, but flanges of the intermediate portion 7 and the lower portion 8 may be joined together using the joining method in FIGS. 3, 4 and 5.

The present invention can be particularly applied to a vacuum heating apparatus that allows annealing at higher than 2000° C. The application to the electron impact heating device is exemplified in which a thermo-electron emitted from a filament by an acceleration voltage is caused to collide with a heater to generate heat, but the present invention may be applied to high frequency induction heating type, infrared heating type, resistance heating type, and other such apparatuses. The present invention is not limited thereto.

The number of the step formed in each flange is not limited to one, but any number of steps may be formed according to a joint surface between heating means and an O ring.

What is claimed is:

1. A vacuum heating apparatus comprising:
a vacuum chamber constituted by first and second members joined together with an opening at the joint;
exhaust means for exhausting gas from said vacuum chamber; and
heating means placed in the opening for heating a substrate placed in said vacuum chamber,
wherein joint surfaces of said first and second members are sealed by an O ring,
wherein steps are provided on the joint surfaces of said first and second members to form bonding steps between said heating means and said O ring, and
wherein the bonding steps prevent thermo-radiation from said opening from directly reaching said O ring.

2. The vacuum heating apparatus according to claim 1, wherein said joint surfaces at the inside of said O ring have greater surface roughness than portions other than said joint surfaces.

3. The vacuum heating apparatus according to claim 2, wherein the joint surfaces at the inside of said O ring have emissivity of 0.3 or more.

4. The vacuum heating apparatus according to claim 1, wherein a shield plate is provided at the inner peripheral side of said members facing said heating means.

5. The vacuum heating apparatus according to claim 1, wherein said heating means is electron collision heating type heating means in which a thermo-electron emitted from a filament by an acceleration voltage applied between said filament and said vacuum chamber is caused to collide with a heater to generate heat.

6. A vacuum heating apparatus comprising:
a vacuum chamber constituted by first and second members joined together with an opening at the joint;
exhaust means for exhausting gas from said vacuum chamber; and
heating means placed in the opening for heating a substrate placed in said vacuum chamber,
wherein joint surfaces of said first and second members are sealed by an O ring, and
said joint surfaces are configured to prevent thermo-radiation from said heating means from reaching said O ring through said joint surfaces.

* * * * *